(12) United States Patent
Devta Prasanna et al.

(10) Patent No.: US 8,819,508 B2
(45) Date of Patent: Aug. 26, 2014

(54) SCAN TEST CIRCUITRY CONFIGURED TO PREVENT VIOLATION OF MULTIPLEXER SELECT SIGNAL CONSTRAINTS DURING SCAN TESTING

(71) Applicant: LSI Corporation, Milpitas, CA (US)

(72) Inventors: Narendra B. Devta Prasanna, San Jose, CA (US); Ramesh C. Tekumalla, Breinigsville, PA (US)

(73) Assignee: LSI Corporation, San Jose, CA (US)

( * ) Notice: Subject to any disclaimer, the term of this patent is extended or adjusted under 35 U.S.C. 154(b) by 140 days.

(21) Appl. No.: 13/646,154

(22) Filed: Oct. 5, 2012

(65) Prior Publication Data

US 2014/0101501 A1    Apr. 10, 2014

(51) Int. Cl.
*G01R 31/28* (2006.01)
*G01R 31/3185* (2006.01)

(52) U.S. Cl.
CPC .............................. *G01R 31/318544* (2013.01)
USPC ........................................................ 714/727

(58) Field of Classification Search
CPC ................... G01R 31/3185; G01R 31/318533; G01R 31/318536; G01R 31/318544; G01R 31/318555; G01R 31/318558; G01R 31/31872; G01R 31/31926; H03K 21/00
USPC ......... 714/726, 731, 724, 727, 732, 733, 744; 716/136; 377/10
See application file for complete search history.

(56) References Cited

U.S. PATENT DOCUMENTS

| 5,193,092 | A | * | 3/1993 | Hartoog et al. | ................ | 714/732 |
|---|---|---|---|---|---|---|
| 6,452,423 | B1 | | 9/2002 | Das et al. | | |
| 6,636,997 | B1 | | 10/2003 | Wong et al. | | |
| 6,658,617 | B1 | | 12/2003 | Wong | | |
| 6,938,225 | B2 | | 8/2005 | Kundu | | |
| 7,412,672 | B1 | * | 8/2008 | Wang et al. | ................... | 716/136 |
| 7,831,876 | B2 | | 11/2010 | Goyal et al. | | |
| 2004/0250185 | A1 | * | 12/2004 | Date | ............................ | 714/726 |

OTHER PUBLICATIONS

A.A. Al-Yamani et al., "Testing Digital Circuits with Constraints," 17th IEEE International Symposium on Defect and Fault-Tolerance (DFT) in VLSI Systems, Nov. 2002, pp. 195-203, Vancouver, BC, Canada.
S. Mitra et al., "Scan Synthesis for One-Hot Signals," International Test Conference (ITC), Nov. 1997, pp. 714-722.

* cited by examiner

*Primary Examiner* — Guy Lamarre
(74) *Attorney, Agent, or Firm* — Ryan, Mason & Lewis, LLP

(57) ABSTRACT

An integrated circuit comprises a decoder having a plurality of select signal outputs, a multiplexer having a plurality of select signal inputs subject to a specified select signal constraint, and scan test circuitry. The scan test circuitry comprises at least one scan chain having a plurality of scan cells coupled between respective ones of the select signal outputs of the decoder and respective ones of the select signal inputs of the multiplexer. The scan test circuitry is configured to control at least a given one of the scan cells so as to prevent violation of the select signal constraint in conjunction with scan testing. The multiplexer may be, for example, a one-hot multiplexer for which the select signal constraint indicates that only one of the select signal inputs should receive a logic high select signal at a particular time.

23 Claims, 7 Drawing Sheets

SCAN TEST CIRCUITRY CONFIGURED TO PREVENT VIOLATION OF MULTIPLEXER SELECT SIGNAL CONSTRAINTS DURING SCAN TESTING

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of respective input and output scan data, and a scan capture phase in which the flip-flops of the scan chain capture scan data from combinational logic. These two repeating scan test phases are often collectively referred to as a scan test mode of operation of the integrated circuit.

Outside of the scan test mode and its scan shift and capture phases, the integrated circuit may be said to be in a functional mode of operation. Other definitions of the scan test and functional operating modes may also be used. For example, the capture phase associated with a given scan test may instead be considered part of a functional mode of operation, such that the modes include a scan shift mode having only the scan shift phase, and a functional mode that includes the capture phase.

In scan testing of an integrated circuit, capture of non-deterministic values from circuitry under test can lead to significant problems. This is particularly true for integrated circuits that include multiplexers having specified constraints on their select signal inputs, such as so-called "one-hot" multiplexers in which only one of multiple select signal inputs of the multiplexer can be at a logic high signal level at any particular time. Such one-hot multiplexers are commonly used to achieve faster circuit operation in high-speed applications. In order to avoid damaging or otherwise degrading this important functionality of the multiplexer, the select signal constraint of the multiplexer should be satisfied when testing the integrated circuit, including both during external testing using automated test equipment (ATE) as well as during on-chip self-testing using logic built-in self-test (LBIST) circuitry. These and other types of testing commonly involve use of scan test circuitry of the type previously described. However, conventional scan test circuitry is often unable to provide adequate assurances that multiplexer select signal constraints will be satisfied during scan testing of the integrated circuit.

SUMMARY

One or more illustrative embodiments of the invention provide an integrated circuit having scan test circuitry that is configured to prevent violation of multiplexer select signal constraints during scan testing of the integrated circuit.

In one embodiment, an integrated circuit comprises a decoder having a plurality of select signal outputs, a multiplexer having a plurality of select signal inputs subject to a specified select signal constraint, and scan test circuitry. The scan test circuitry comprises at least one scan chain having a plurality of scan cells coupled between respective ones of the select signal outputs of the decoder and respective ones of the select signal inputs of the multiplexer. The scan test circuitry is configured to control at least a given one of the scan cells so as to prevent violation of the select signal constraint in conjunction with scan testing.

The multiplexer may be a one-hot multiplexer for which the specified select signal constraint indicates that only one of the select signal inputs should receive a logic high select signal at a particular time. However, other embodiments may be implemented to address different types of multiplexers and associated select signal constraints, such as so-called "one-cold" multiplexers in which only one of multiple select signal inputs of the multiplexer can be at a logic low signal level at any particular time.

The scan test circuitry may be configured to control the scan cells so as to prevent violation of the select signal constraint in conjunction with scan testing without requiring gating of any scan cell outputs.

In some embodiments, the decoder may comprise a functional decoder and the integrated circuit may further comprise a test decoder having functionality substantially the same as that of the functional decoder. For example, in such an arrangement, inputs of the test decoder are coupled to respective outputs of respective arbitrarily-selected scan cells of the scan chain, where the scan cell outputs may be test decoder outputs or scan outputs. Also, outputs of the test decoder are coupled to respective test decoder inputs of respective scan cells of the scan chain. Accordingly, during a scan shift mode of operation, the scan cells may be configured such that the test decoder inputs of the respective scan cells control respective functional data outputs of those scan cells in a manner that prevents violation of the select signal constraint of the multiplexer.

The illustrative embodiments can provide improved scan testing of an integrated circuit relative to conventional arrangements. For example, a given such embodiment can ensure that multiplexer select signal constraints, such as one-hot constraints and one-cold constraints, are always satisfied during test, whether involving ATE, LBIST or other types of test environments, with or without scan compression. In addition, these improvements can be achieved without requiring the addition of any circuitry into multiplexer functional paths, and thus with no degradation to functional performance of the integrated circuit.

DETAILED DESCRIPTION

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by preventing violation of multiplexer select signal constraints during scan testing of the integrated circuit.

Figure 1:
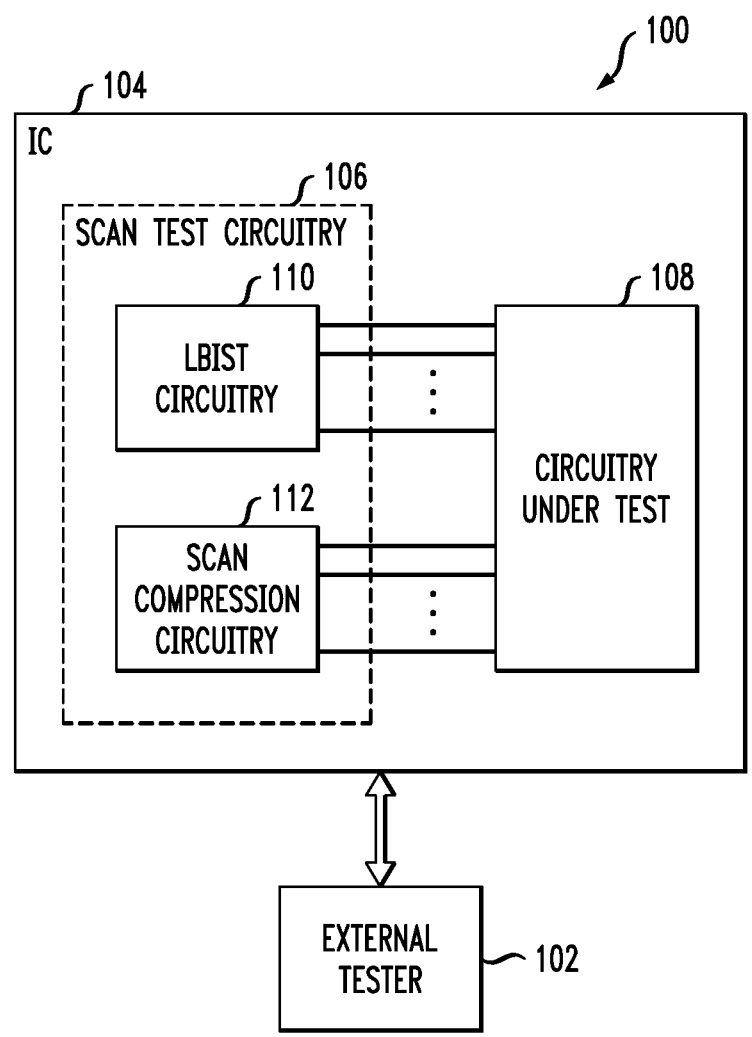
FIG. 1 is a block diagram showing an integrated circuit testing system comprising an integrated circuit that includes scan test circuitry and circuitry under test.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 in the present embodiment is an external tester relative to the integrated circuit 104, but in other embodiments may be at least partially incorporated into the integrated circuit 104.

The scan test circuitry 106 of the integrated circuit 104 in the present embodiment comprises LBIST circuitry 110 and scan compression circuitry 112, both of which are coupled to the circuitry under test 108. In other embodiments, the scan test circuitry 106 may comprise either LBIST circuitry 110 or scan compression circuitry 112, but not both as in the present embodiment. Embodiments of the present invention may therefore be configured to utilize compressed or noncompressed scan testing, and embodiments of the invention are not limited in this regard.

The LBIST circuitry 110 will be described in greater detail below in conjunction with FIG. 2, and comprises a plurality of scan chains. Each of the individual scan chains is configurable to operate as a serial shift register in a scan shift mode of operation of the integrated circuit 104 and also to capture functional data from combinational logic elements or other functional logic of the circuitry under test 108 in a functional mode of operation of the integrated circuit 104.

The scan compression circuitry 112 is assumed in the present embodiment to include one or more additional sets of scan chains, not necessarily part of the LBIST circuitry 110, that operate in conjunction with compressed scan testing carried out utilizing external tester 102 and scan compression circuitry 112. Thus, in this embodiment, the external tester 102 and scan compression circuitry 112 are utilized for compressed scan testing of one or more portions of the circuitry under test 108, and the LBIST circuitry 110 is utilized for scan testing of one or more portions of the circuitry under test 108, where the same portions of the circuitry under test 108 may be targeted by both the scan compression and LBIST circuitry. It should therefore be understood that the LBIST circuitry 110 and scan compression circuitry 112 may both target the same functional logic in the circuitry under test 108. Also, the LBIST circuitry 110 may be controlled at least in part by the external tester 102. The external tester 102 is therefore not limited to use with the scan compression circuitry 112. Again, other embodiments could perform just LBIST testing or just scan compression testing.

The scan compression circuitry 112 is assumed to more particularly comprise a decompressor, a compressor, and a plurality of scan chains arranged in parallel between outputs of the decompressor and inputs of the compressor. The decompressor is configured to receive compressed scan data from the tester 102 and to decompress that scan data to generate scan test input data that is shifted into the scan chains when such chains are configured as respective serial shift registers in a scan shift mode of operation. The compressor is configured to receive scan test output data shifted out of the scan chains, also when such chains are configured as respective serial shift registers in the scan shift mode of operation, and to compress that scan test output data for delivery back to the tester 102.

The number of scan chains utilized by the scan compression circuitry 112 is generally much larger than the number of decompressor inputs or compressor outputs. The ratio of the number of scan chains to the number of decompressor inputs or compressor outputs provides a measure of the degree of scan test pattern compression provided in the scan compression circuitry 112. It should be noted, however, that the number of compressor outputs need not be the same as the number of decompressor inputs.

Additional details regarding the operation of scan compression elements such as the above-noted decompressor and compressor may be found in U.S. Pat. No. 7,831,876, entitled "Testing a Circuit with Compressed Scan Chain Subsets," which is commonly assigned herewith and incorporated by reference herein.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Figure 2:
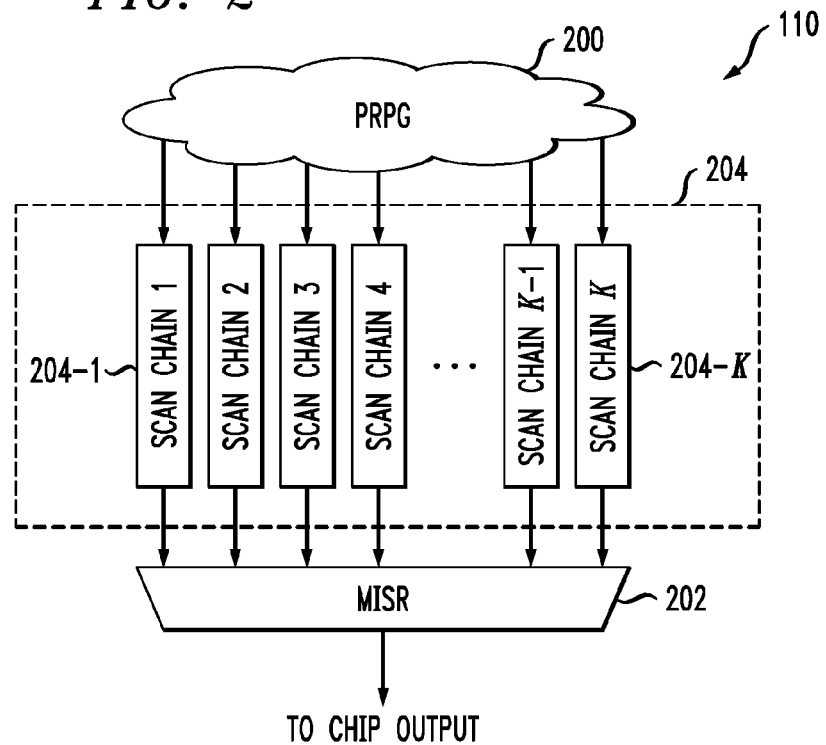
FIG. 2 shows a more detailed view of a portion of the integrated circuit of FIG. 1.

Referring now to FIG. 2, portions of LBIST circuitry 110 are shown in greater detail. In this embodiment, the LBIST circuitry 110 comprises a pseudo random pattern generator (PRPG) 200, a multiple input shift register (MISR) 202, and a plurality of scan chains 204-$k$, where k=1, 2, ... K, arranged in parallel between the PRPG 200 and the MISR 202. An output of the MISR 202 is coupled to a designated chip output of the integrated circuit 104.

Like the other scan chains previously described, each of the scan chains 204 comprises a plurality of scan cells, and is configurable to operate as a serial shift register in a scan shift mode of operation of the integrated circuit 104 and to capture functional data from circuitry under test 108 in a functional mode of operation of the integrated circuit 104. The scan chains 204 may be associated with multiple distinct clock domains, or a single clock domain. However, it will be assumed for embodiments to be described herein that the scan chains are associated with a single clock domain.

As will be described in greater detail below, one or more of the scan chains 204 may be configured to prevent violation of multiplexer select signal constraints during scan testing of the integrated circuit 104. Other scan chains of the scan test circuitry 106, such as those that are part of or otherwise associated with the scan compression circuitry 112, may additionally or alternatively be configured in a similar manner.

The first scan chain 204-1 is of length $n_1$ and therefore comprises $n_1$ scan cells. More generally, scan chain 204-$k$ is of length $n_k$ and therefore comprises a total of $n_k$ scan cells. In some embodiments of the invention, the lengths of the scan chains 204 are balanced so that the same amount of time is needed to shift the desired set of scan test patterns into all of the scan chains. It may therefore be assumed without limitation that all of the scan chains 204 are of the same length n, such that $n_1=n_2=\ldots=n_k=n$.

The circuitry under test 108 in this embodiment may comprise a plurality of logic blocks separated from one another by the scan chains 104. Such logic blocks may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. Other types of shift modes or phases can be used.

In the exemplary LBIST circuitry arrangement of FIG. 2, the PRPG 200 generates scan test patterns and serially shifts them into the scan chains 204 during scan shift mode. Once an entire scan test pattern has been shifted in, scan capture is performed. After scan capture, the resulting captured patterns are shifted out of the scan chains to the MISR 202. The MISR accumulates a signature at the end of each pattern and eventually when all the patterns are applied, a final signature is shifted out serially to a chip primary output or another observation point for analysis.

Figure 3:
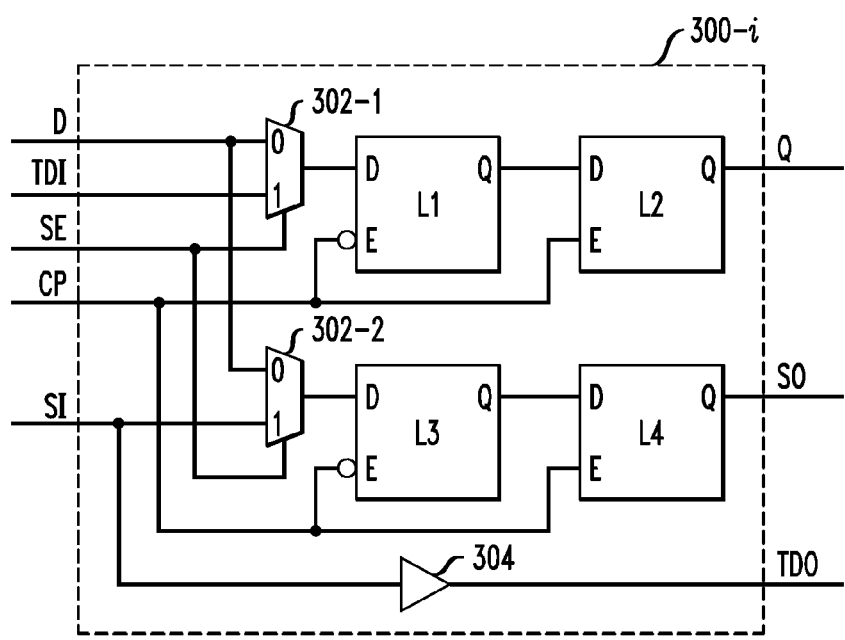
FIG. 3 is a schematic diagram of a scan cell of the scan test circuitry in one embodiment.

FIG. 3 shows an exemplary scan cell 300-$i$, $i=1, 2, \ldots n$, that is part of a given one of the scan chains 204 or another scan chain of the scan test circuitry 106 in an illustrative embodiment.

Figure 4:
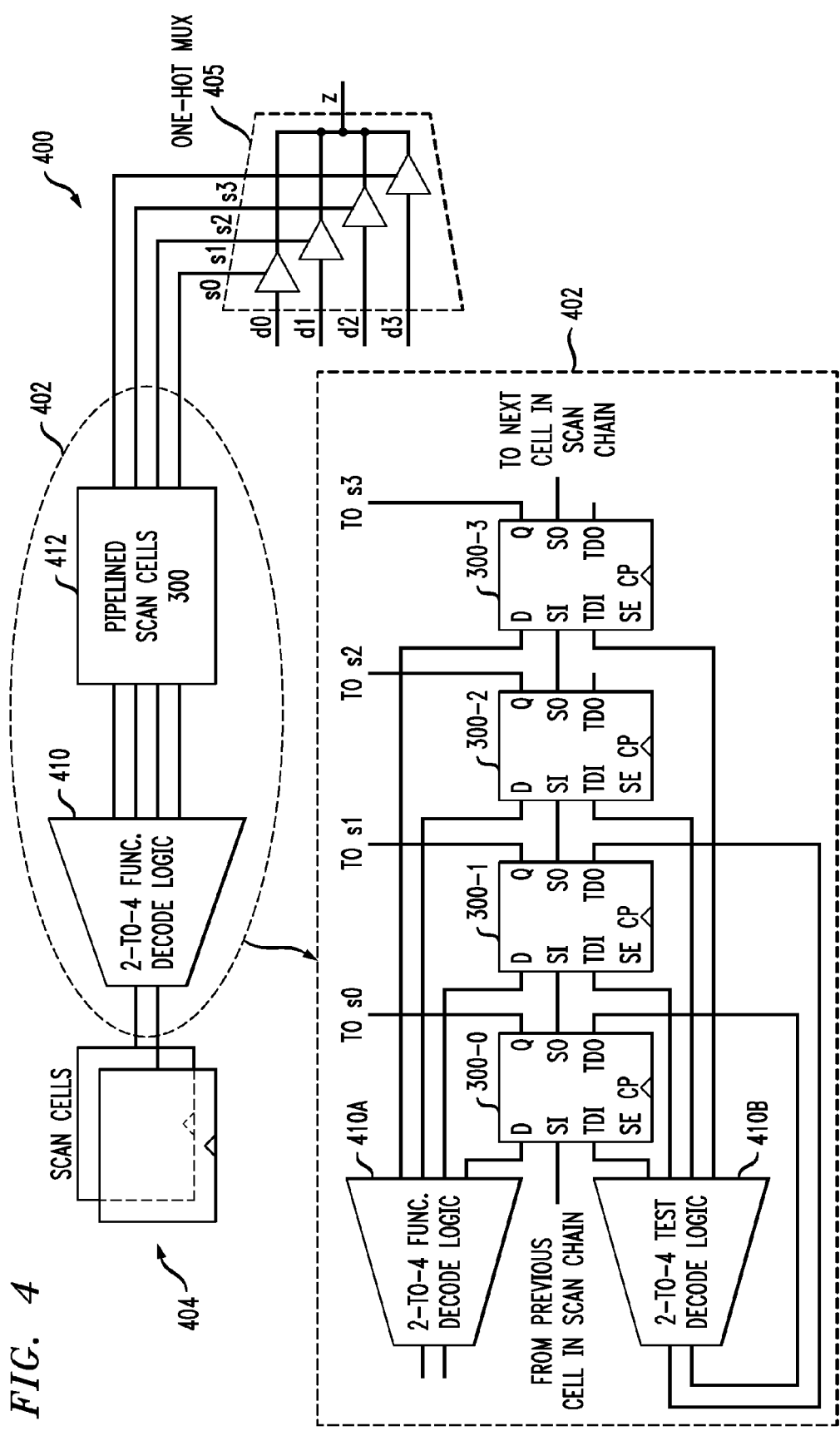
FIG. 4 illustrates the manner in which multiple scan cells of the type shown in FIG. 3 can be arranged between a decoder and a one-hot multiplexer.

One possible manner in which multiple scan cells 300 of the type shown in FIG. 3 can be arranged to form a scan chain in a portion 400 of integrated circuit 104 is illustrated in FIG. 4. As shown, portion 400 comprises circuitry 402 coupled between a set of scan cells 404 and a one-hot multiplexer 405. The circuitry 402 includes 2-4 functional decode logic 410 that has four select signal outputs, and a scan chain 412 comprising pipelined scan cells 300. The pipelined scan cells more particularly comprise at least four scan cells 300-0, 300-1, 300-2 and 300-3, each configured as illustrated in FIG. 3.

The multiplexer 405 has four select signal inputs denoted s0, s1, s2 and s3. These select signal inputs are subject to a specified signal constraint, namely, a one-hot signal constraint indicating that only one of the four select signal inputs should receive a logic high select signal at a particular time. The four select signal inputs s0, s1, s2 and s3 are generally driven by respective ones of the four select signal outputs of the 2-4 functional decode logic 410 via respective ones of the scan cells 300-0, 300-1, 300-2 and 300-3.

The multiplexer 405 also has four data inputs d0, d1, d2 and d3 and a data output z. Depending on which one of the select signal inputs s0, s1, s2 or s3 receives a logic high select signal, the multiplexer selects a corresponding one of its data inputs d0, d1, d2 or d3 for coupling to its data output z.

The scan cells 300 in this embodiment are inserted following the 2-4 functional decode logic 410 in a pipelined arrangement in order to facilitate high-speed operation of the circuit portion 400. During functional operation, the pipelined scan cells 300 driving the one-hot multiplexer 405 receive their inputs from the functional decode logic 410, so the multiplexer one-hot constraint will be satisfied. During scan test, however, the pipelined scan cells are configured as part of a scan chain, which can lead to one-hot violations absent use of the control mechanisms to be described.

The scan chain 412 comprising pipelined scan cells 300 is configured such that the scan cells 300-0, 300-1, 300-2 and 300-3 are coupled between respective ones of the select signal outputs of the 2-4 functional decode logic 410 and respective ones of the select signal inputs s0, s1, s2 and s3 of the multiplexer 405. As will be described in more detail below, the pipelined scan cells 300 are controlled so as to prevent violation of the select signal constraint of the multiplexer 405 in conjunction with scan testing. In the present embodiment, this violation prevention is achieved without requiring gating of the scan cell outputs. Accordingly, there is no need to add circuitry into multiplexer functional paths, and thus no degradation in functional performance of the integrated circuit.

The 2-4 functional decode logic 410 is an example of what is more generally referred to herein as a "decoder." Numerous other types and configurations of decoders, with different numbers and arrangements of inputs and outputs, may be used in other embodiments. Accordingly, the use of two inputs and four outputs for the functional decode logic 410 in the present embodiment is presented by way of illustrative example only, and should not be viewed as limiting in any way. Similarly, the use of four select signal inputs for the multiplexer 405 is only an example, and different numbers and arrangements of multiplexer inputs and outputs can be used in other embodiments.

Also, the use of a one-hot signal constraint for multiplexer 405 in the present embodiment is exemplary only. For example, other embodiments may be implemented using different types of multiplexers and associated select signal constraints, such as so-called "one-cold" multiplexers in which only one of multiple select signal inputs of the multiplexer can be at a logic low signal level at any particular time.

As illustrated in FIG. 4, the 2-4 functional decode logic 410 of circuitry 402 more particularly comprises two distinct sets of 2-4 functional decode logic, namely, a functional decoder 410A and a test decoder 410B having functionality substantially the same as that of the functional decoder 410A. Accordingly, the functional decoder 410A is configured such that its four select signal outputs satisfy the one-hot constraint of the multiplexer 405 under all signaling conditions, and the test decoder 410B operates in substantially the same manner, in that it provides four output signals that also satisfy the one-hot constraint. Inputs of the test decoder 410B are coupled to respective outputs of respective scan cells 300-0 and 300-1 of the scan chain 412.

Referring again to FIG. 3, the scan cell 300-$i$ which corresponds to any of the scan cells 300-0 through 300-3 has a functional data input (D), a functional data output (Q), a scan input (SI), a scan output (SO), a shift enable input (SE), a clock input (CP), a test decoder input (TDI) and a test decoder output (TDO), although a given such scan cell may include a variety of other arrangements of inputs and outputs in other embodiments, as will be appreciated by those skilled in the art. For example, the same scan cell output may serve as a scan output in the scan shift mode of operation and as a functional data output in the functional mode of operation, instead of the scan cell providing separate scan and functional data outputs.

It is to be appreciated, however, that embodiments of the invention are not limited in terms of the types of scan cells that are used in a given scan chain of the scan test circuitry 106. Also, notation such as D, Q, SI, SO, SE, CP, TDI and TDO may be used herein to refer not only to the scan cell inputs or outputs but also to the corresponding signals.

A shift enable signal applied to the shift enable inputs of respective scan cells of a given scan chain causes the scan cells of that scan chain to form a serial shift register during scan testing. For example, the scan cells of a scan chain can form a serial shift register responsive to the SE signal being at a first designated logic level (e.g., a logic "1" level) and the scan cells of the scan chain can capture functional data when the SE signal is at a second designated logic level (e.g., a logic "0" level). Other logic levels and shift enable signaling arrangements can be used in other embodiments.

The scan cell 300-$i$ further comprises a first circuit comprising a master latch L1 and a slave latch L2, a second circuit comprising a master latch L3 and a slave latch L4, selection circuitry illustratively comprising two two-to-one multiplexers 302-1 and 302-2, and a buffer circuit 304. Each of the latches L1, L2, L3 and L4 and other latches referred to herein comprises a data input, a data output and an enable input, which are denoted as D, Q and E, respectively, although the latch data inputs and outputs should be distinguished from the functional data input and functional data output of the corresponding scan cell, which as indicated above are also denoted D and Q, respectively.

The selection circuitry is configured to couple a selected one of the functional data input D and the test decoder input TDI to the data input of the master latch L1 via multiplexer 302-1 responsive to a logic level of the SE signal, and is further configured to couple a selected one of the functional data input D and the scan input SI to the data input of the master latch L3 via the multiplexer 302-2 responsive to the logic level of the SE signal. Outputs of the respective slave latches L2 and L4 of the first and second circuits are coupled to the respective functional data output Q and scan output SO of the scan cell 300-$i$. Also, the scan input SI of the scan cell 300-$i$ is coupled to an input of the buffer circuit 304, and the output of the buffer circuit 304 is coupled to the test decoder output TDO of the scan cell 300-$i$.

In the above-described arrangement, during a scan shift mode of operation when the SE signal is at a logic high level, the test decoder input TDI of the scan cell 300-$i$ is coupled to the input of the master latch L1 such that the functional data output Q of the scan cell is controlled by an output of the test decoder 410B.

It should be understood that a wide variety of other arrangements of latches, selection circuitry and other circuit components may be used to implement the scan cells 300 in other embodiments.

Returning again to FIG. 4, it can be seen that the two inputs of the test decoder 410B are coupled to respective test decoder outputs of respective scan cells 300-0 and 300-1 of the scan chain 412. Also, the four outputs of the test decoder 410B are coupled to respective test decoder inputs of respective scan cells 300-0, 300-1, 300-2 and 300-3 of the scan chain 412. In addition, the functional data inputs of the scan cells 300-0, 300-1, 300-2 and 300-3 are driven by the select signal outputs of the functional decoder 410A, and the functional data outputs of the scan cells 300-0, 300-1, 300-2 and 300-3 drive the respective select signal inputs s0, s1, s2 and s3 of the multiplexer 405. During a scan shift mode of operation, the scan cells 300 are configured such that the test decoder inputs of the respective scan cells control the respective functional data outputs of those scan cells in a manner that prevents violation of the select signal constraint of the multiplexer 405.

The scan cell 300-0 is more particularly arranged in the circuitry 402 such that its functional data input D is coupled to one of the select signal outputs of the functional decoder 410A, its functional data output Q is coupled to one of the select signal inputs of the multiplexer 405, its scan input SI is coupled to a scan output of a previous one of the scan cells of the scan chain, its scan output SO is coupled to a scan input SI of a subsequent one of the scan cells of the scan chain, its test decoder input TDI is coupled to an output of the test decoder 410B, and its test decoder output TDO is coupled to an input of the test decoder 410B. The scan cell 300-1 is configured in substantially the same manner. The other two scan cells 300-2 and 300-3 are also similarly configured, but their TDO outputs are not connected to inputs of the test decoder 410B, as the test decoder has only two inputs in this embodiment. It should be noted that selection of the TDO outputs of scan cells 300-0 and 300-1 for application to the inputs of the test decoder 410B is arbitrary, as TDO outputs from any two of the scan cells 300 could be used for this purpose.

Figure 5:
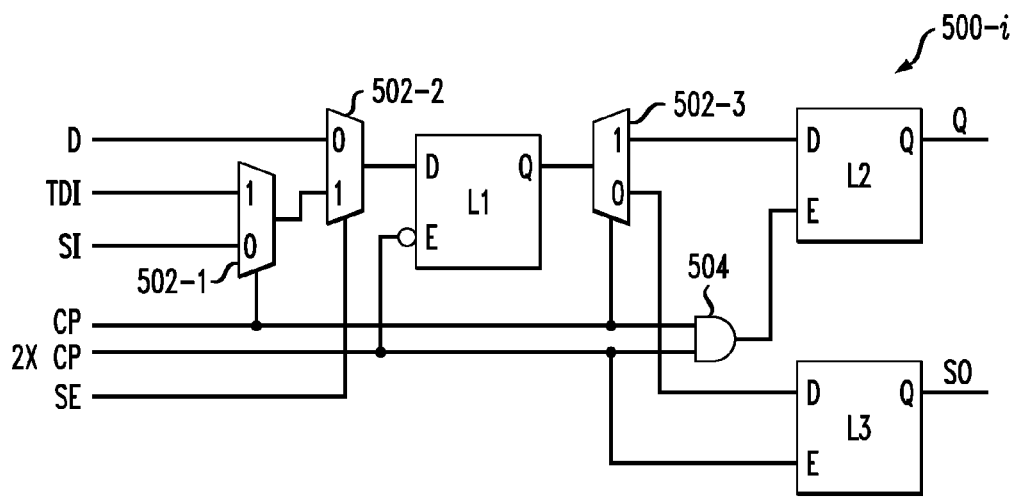
FIG. 5 is a schematic diagram of a scan cell of the scan test circuitry in another embodiment.
Figure 6:
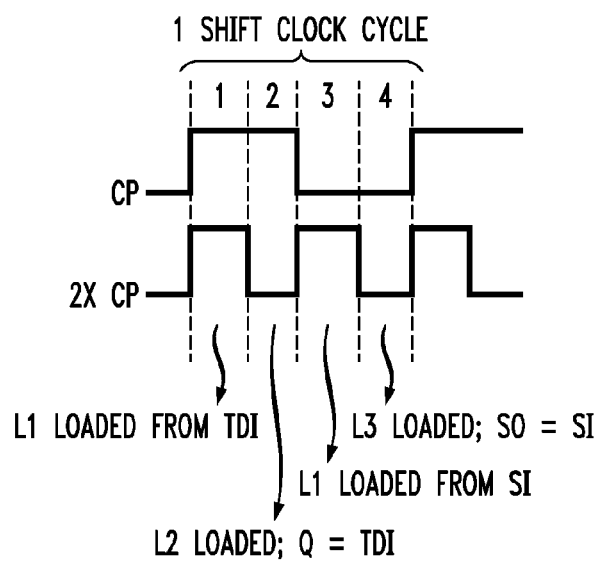
FIG. 6 is a timing diagram showing the operation of the FIG. 5 scan cell.
Figure 7:
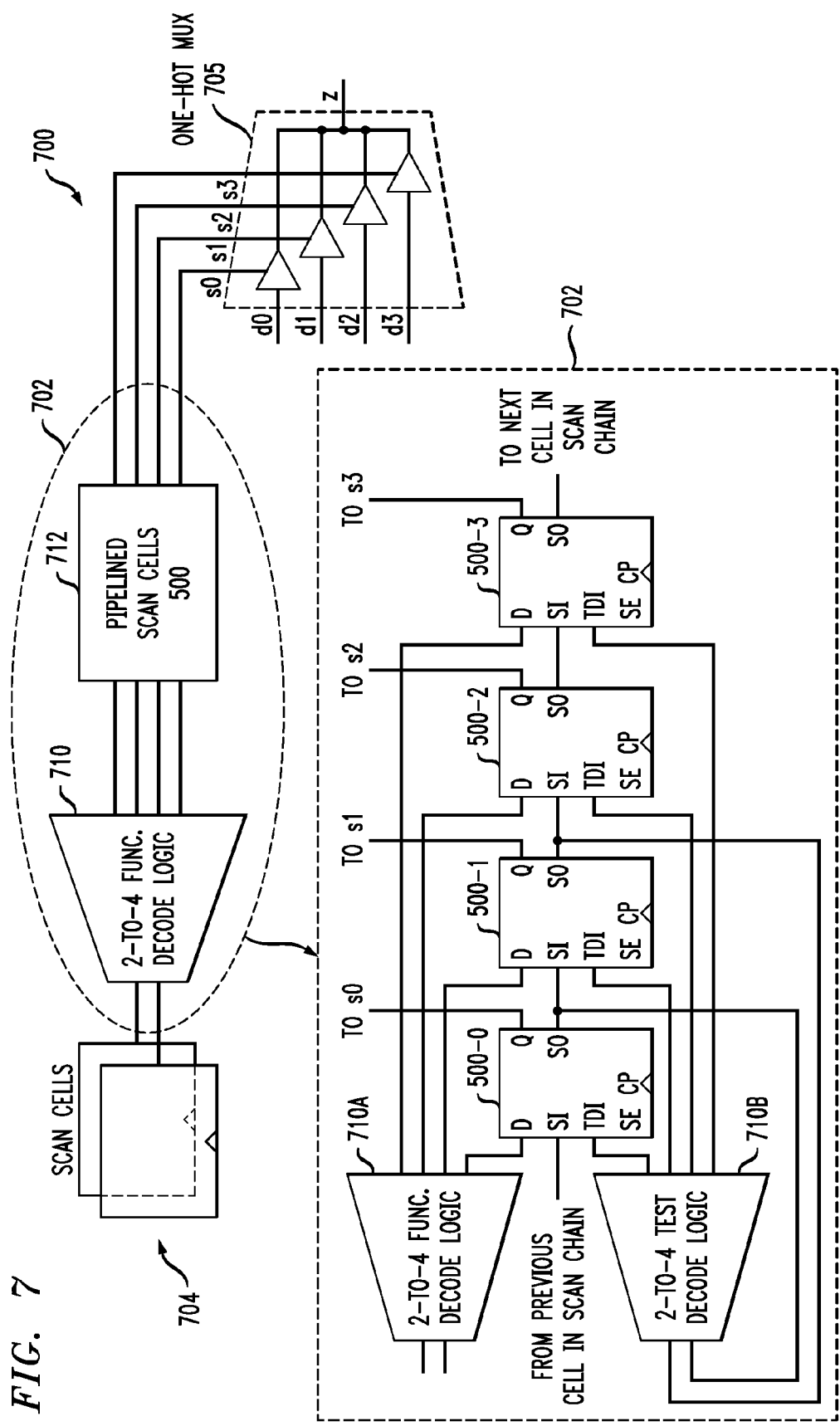
FIG. 7 illustrates the manner in which multiple scan cells of the type shown in FIG. 5 can be arranged between a decoder and a one-hot multiplexer.

FIGS. 5-7 illustrate the operation of an embodiment that utilizes pipelined scan cells 500, a given one of which is shown in FIG. 5. The scan cell 500-$i$ of FIG. 5 has the same general inputs D, SI, SE, CP and TDI and outputs Q and SO as the scan cell 300-$i$ of FIG. 3, but does not include any TDO output. It also includes an additional clock input, denoted in the figure as 2X CP, that is not present in the scan cell 300-$i$. The 2X CP input receives a clock signal having a rate that is twice the rate of the clock signal CP. The clock signals CP and 2X CP are also referred to herein as first and second clock signals, respectively.

The scan cell 500-$i$ further comprises first, second and third latches L1, L2 and L3, selection circuitry illustratively comprising three two-to-one multiplexers 502-1, 502-2 and 502-3, and a logic gate 504 illustratively implemented as a two-input AND gate. The selection circuitry is configured to couple a selected one of the functional data input D, the test decoder input TDI and the scan input SI to the data input of the first latch L1 via multiplexers 502-1 and 502-2 responsive to respective logic levels of the shift enable signal SE and the first clock signal CP. The selection circuitry is further configured to couple the data output of the first latch L1 to a selected one of the data input of the second latch L2 and the data input of the third latch L3 via multiplexer 502-3 responsive to the logic level of the first clock signal CP.

The enable inputs of the first, second and third latches L1, L2 and L3 are configured in the following manner. The first latch L1 has an enable input of a first type that receives the second clock signal 2X CP, and the third latch L3 has an enable input of a second type different than the first type but also receives the second clock signal 2X CP. In this embodiment, the enable input of the first type is an active low enable input and the enable input of the second type is an active high enable input. Also, the second latch L2 has an enable input of the second type, active high in this embodiment, and receives a third clock signal that is generated by the logic gate 504 as a function of the first and second clock signals.

Outputs of the respective second and third latches L2 and L3 are coupled to the respective functional data output Q and scan output SO of the scan cell 500-$i$.

In the above-described arrangement, during a scan shift mode of operation when the SE signal is at a logic high level, the test decoder input TDI of the scan cell 500-$i$ is coupled to the input of the first latch L1 such that the functional data output Q of the scan cell is controlled by an output of the test decoder 710B of FIG. 7.

Again, a wide variety of other arrangements of latches, selection circuitry and other circuit components may be used to implement the scan cells 500 in other embodiments.

FIG. 6 shows a timing diagram illustrating the operation of the scan cell 500-$i$ of FIG. 5. The timing diagram shows portions of first and second clock signals CP and 2X CP corresponding to one shift clock cycle, and indicates the manner in which the latches L1, L2 and L3 are loaded during particular time intervals within that shift clock cycle. The time intervals are labeled 1, 2, 3 and 4 in the figure, and correspond to respective half-cycles of the 2X CP clock signal. In time interval 1, L1 is loaded from the TDI input of the scan cell. In time interval 2, L2 is loaded and the scan cell functional output Q is then equal to TDI as previously loaded into L1. In time interval 3, L1 is loaded from the SI input of the scan cell. Finally, in time interval 4, L3 is loaded and the scan cell scan output SO is then equal to SI as previously loaded into L1.

Referring now to FIG. 7, one possible manner in which multiple scan cells 500 of the type shown in FIG. 5 can be arranged to form a scan chain in a portion 700 of integrated circuit 104 is illustrated. As shown, portion 700 comprises circuitry 702 coupled between a set of scan cells 704 and a one-hot multiplexer 705. The circuitry 702 includes 2-4 functional decode logic 710 that has four select signal outputs, and a scan chain 712 comprising pipelined scan cells 500. The pipelined scan cells more particularly comprise at least four scan cells 500-0, 500-1, 500-2 and 500-3, each configured as illustrated in FIG. 5. The arrangement and operation of elements 702, 704, 705, 710 and 712 is generally similar to that of respective elements 402, 404, 405, 410 and 412 of the FIG. 4 embodiment, but the inputs of the test decoder 710B are driven by scan outputs SO of the scan cells 500-0 and 500-1, rather than scan cell test decoder outputs TDO as in the FIG. 4 embodiment.

Accordingly, it can be seen that the two inputs of the test decoder 710B are coupled to respective scan outputs of respective scan cells 500-0 and 500-1 of the scan chain 712. Also, the four outputs of the test decoder 710B are coupled to respective test decoder inputs of respective scan cells 500-0, 500-1, 500-2 and 500-3 of the scan chain 712. In addition, the functional data inputs of the scan cells 500-0, 500-1, 500-2 and 500-3 are driven by the select signal outputs of the functional decoder 710A, and the functional data outputs of the scan cells 500-0, 500-1, 500-2 and 500-3 drive the respective select signal inputs s0, s1, s2 and s3 of the multiplexer 705. During a scan shift mode of operation, the scan cells 500 are configured such that the test decoder inputs of the respective scan cells control the respective functional data outputs of those scan cells in a manner that prevents violation of the select signal constraint of the multiplexer 705.

The scan cell 500-0 is more particularly arranged in the circuitry 502 such that its functional data input D is coupled to one of the select signal outputs of the functional decoder 710A, its functional data output Q is coupled to one of the select signal inputs of the multiplexer 705, its scan input SI is coupled to a scan output of a previous one of the scan cells of the scan chain, its scan output SO is coupled to a scan input SI of a subsequent one of the scan cells of the scan chain and to an input of the test decoder 710B, and its test decoder input TDI is coupled to an output of the test decoder 710B. The scan cell 500-1 is configured in substantially the same manner. The other two scan cells 500-2 and 500-3 are also similarly configured, but their SO outputs are not connected to inputs of the test decoder 710B, as the test decoder has only two inputs in this embodiment. It should be noted that selection of the TDO outputs of scan cells 500-0 and 500-1 for application to the inputs of the test decoder 710B is arbitrary, as TDO outputs from any two of the scan cells 500 could be used for this purpose.

Figure 8:
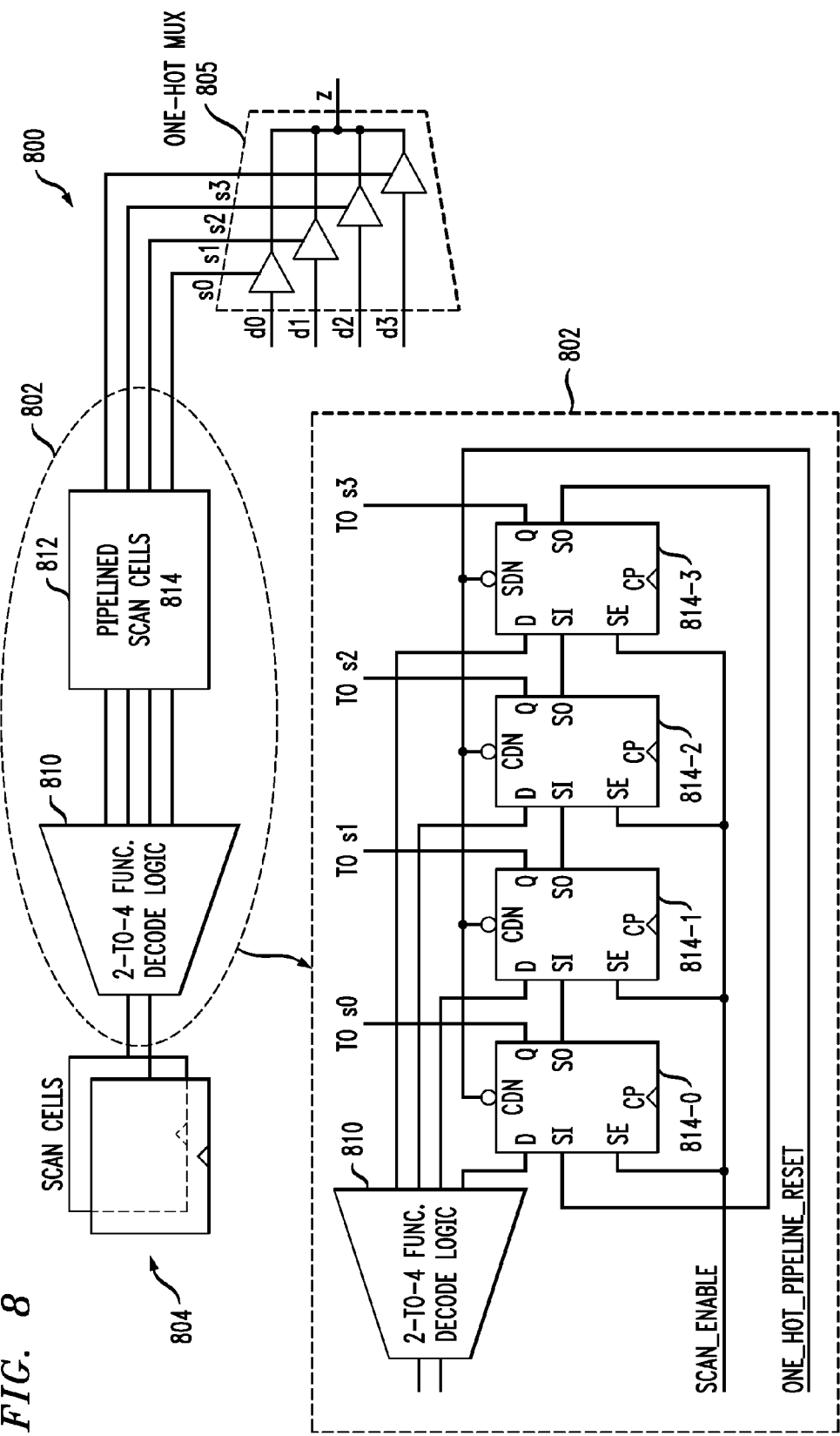
FIG. 8 shows yet another embodiment of scan test circuitry having scan cells arranged between a decoder and a one-hot multiplexer and in which the scan cells can be configured to form a circular shift register.

FIG. 8 shows another illustrative embodiment, including a portion 800 of integrated circuit 104 comprising circuitry 802 coupled between a set of scan cells 804 and a one-hot multiplexer 805. The circuitry 802 includes 2-4 functional decode logic 810 that has four select signal outputs, and a scan chain 812 comprising pipelined scan cells 814. The pipelined scan cells more particularly comprise four scan cells 814-0, 814-1, 814-2 and 814-3, each of which has D, SI, SE and CP inputs and Q and SO outputs. These scan cells also each comprise at least one of a reset input denoted CDN and a set input denoted SDN.

The arrangement and operation of elements 802, 804, 805, 810 and 812 is generally similar to that of the corresponding elements of the FIG. 4 and FIG. 7 embodiments, but the test decoder is eliminated in the present embodiment such that 2-4 functional decode logic 810 comprises only a functional decoder.

Also, during a scan shift mode of operation, the scan cells 814 are configured to form a circular shift register, with the SI input of the initial scan cell 814-0 being coupled to the SO output of the final scan cell 814-3. As in the previous embodiments, the number of scan cells shown is by way of example only, and so the circular shift register in the present embodiment may alternatively include more or fewer scan cells.

The scan cells 814 of the FIG. 8 embodiment are also configured such that all of the scan cells of the scan chain 812 other than a selected one of the scan cells have asynchronous reset inputs CDN coupled to a reset signal line and the selected one of the scan cells has an asynchronous set input SDN coupled to the reset signal line. Thus, as more particularly illustrated in the figure, the selected scan cell having its set input SDN coupled to the ONE_HOT_PIPELINE_RESET signal line is scan cell 814-3, and the other three scan cells 814-0, 814-1 and 814-2 each have their reset inputs CDN coupled to the ONE_HOT_PIPELINE_RESET signal line. The SE inputs of each of the scan cells 814 are driven by an SE signal line more particularly denoted as SCAN_ENABLE in the figure.

In the present embodiment, application of a reset signal to the ONE_HOT_PIPELINE_RESET signal line in a test initialization mode of operation prior to the scan shift mode of operation prevents violation of the select signal constraint of the multiplexer 805 during the scan shift mode of operation.

More particularly, during test initialization, before the first scan vector is shifted in, the ONE_HOT_PIPELINE_RESET signal is asserted once and this ensures that all scan cells

814-0, 814-1 and 814-2 for which the signal is applied to their asynchronous reset input will have a logic "0" functional output value and the single scan cell 814-3 for which the signal is applied to its asynchronous set input will have a logic "1" functional output value. Accordingly, at the end of test initialization, the functional data outputs of the pipelined scan cells 814 will necessarily satisfy the one-hot constraint of the multiplexer 805.

During scan shift, SCAN_ENABLE=1 and during each clock cycle of the shift process, the initial one-hot value is circulated through the circular shift register formed by the scan cells 814, thereby ensuring that the one-hot constraint continues to be satisfied.

During scan capture, SCAN_ENABLE=0 and the functional inputs D of the pipelined scan cells 814 are received from the 2-4 functional decode logic 810 and therefore these inputs also satisfy the one-hot constraint. Thus, in each capture cycle, the values captured in the pipelined scan cells 814 always satisfy the one-hot constraint.

After scan capture, when the next test vector is being shifted in and the response of the previous vector is being shifted out, SCAN_ENABLE=1. This configures the pipelined scan cells 814 back into a circular shift register, and since the values captured in the last clock cycle of the scan capture satisfy the one-hot constraint, the values during the first cycle of scan shifting also satisfy the one-hot constraint. Therefore, once the ONE_HOT_PIPELINE_RESET has been asserted during test initialization, the pipelined scan cells will always satisfy the one-hot constraint during the entire subsequent test application process. The same test initialization may also be utilized for LBIST testing and other test applications to ensure one-hot compliance during scan shift.

The ONE_HOT_PIPELINE_RESET signal may be a global signal generated from shared input-output circuitry of the integrated circuit 104. In addition, this reset signal may be gated with a SCAN_MODE signal that is at a logic high level during scan test and at a logic low level during functional operation. All instances of one-hot multiplexers in the integrated circuit 104 may be driven by the same ONE_HOT_PIPELINE_RESET signal in this embodiment. Gating the ONE_HOT_PIPELINE_RESET signal with the SCAN_MODE signal ensures that during functional operation the former signal is always de-asserted and therefore will not interfere with functional operation.

The FIG. 8 embodiment requires less area overhead than the FIG. 4 and FIG. 7 embodiments, but requires an additional global signal that may be driven, for example, through an otherwise conventional JTAP register. Also, generation of test patterns in an ATPG can be more complex in this embodiment. However, in order to facilitate ATPG testing in the FIG. 8 embodiment, one extra capture clock pulse may be used to initialize the pipelined scan cells 814 during scan capture. This extra capture clock pulse may be a slow speed clock pulse rather than an at-speed clock pulse.

It is to be appreciated that the particular circuitry arrangements shown in FIGS. 1-5 and 7 are presented by way of illustrative example only, and numerous alternative arrangements of integrated circuit scan test circuitry may be used to provide an ability to prevent violation of multiplexer select signal constraints during scan testing in the manner disclosed herein. As indicated above, this functionality can be implemented in one or more of the illustrative embodiments without the use of gating circuitry in the multiplexer functional paths and therefore without any significant negative performance impact on the functional operation of the integrated circuit.

The tester 102 in the testing system 100 of FIG. 1 may be implemented in a wide variety of different configurations. Various conventional testing system arrangements can therefore be modified in a straightforward manner to support the scan test circuitry functionality disclosed herein.

Figure 9:
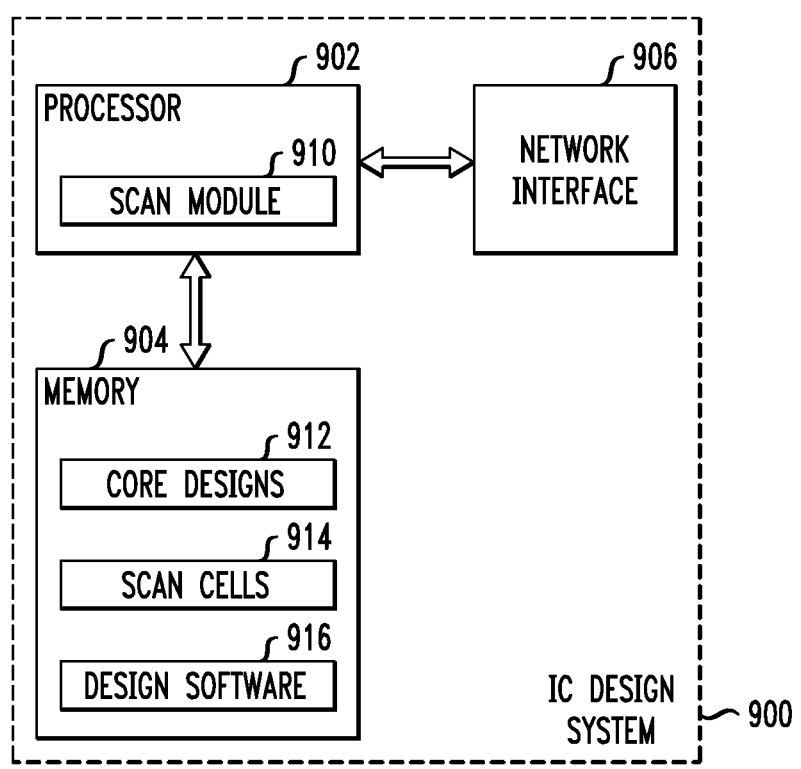
FIG. 9 is a block diagram of a processing system for generating an integrated circuit design in which violation of multiplexer select signal constraints is prevented using techniques such as those illustrated in FIGS. 3 through 8.

The insertion of scan cells to form scan chains in scan test circuitry of an integrated circuit design may be performed in a processing system 900 of the type shown in FIG. 9. Such a processing system in this embodiment more particularly comprises an integrated circuit design system configured for use in designing integrated circuits such as integrated circuit 104 to include scan test circuitry 106 comprising at least one of LBIST circuitry 110 and scan compression circuitry 112.

The system 900 comprises a processor 902 coupled to a memory 904. Also coupled to the processor 902 is a network interface 906 for permitting the processing system to communicate with other systems and devices over one or more networks. The network interface 906 may therefore comprise one or more transceivers.

The processor 902 implements a scan module 910 for supplementing core designs 912 with scan cells 914 at least a subset of which are configured so as to be controllable to prevent violation of multiplexer select signal constraints in the manner disclosed herein, in conjunction with utilization of integrated circuit design software 916.

Elements such as 910, 912, 914 and 916 are implemented at least in part in the form of software stored in memory 904 and processed by processor 902. For example, the memory 904 may store program code that is executed by the processor 902 to implement particular scan chain configuration functionality of module 910 within an overall integrated circuit design process. The memory 904 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 902 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

It should once again be emphasized that the embodiments of the invention as described herein are intended to be illustrative only. For example, other embodiments of the invention can be implemented using a wide variety of other types of scan test circuitry, with different types and arrangements of scan chains, scan cells and other elements, as well as different types and arrangements of decoders, multiplexers, latches, switching circuitry, logic gates, select signal constraints and control signaling, than those included in the embodiments described herein. These and numerous other alternative embodiments within the scope of the following claims will be readily apparent to those skilled in the art.

What is claimed is:

1. An integrated circuit comprising:
a decoder having a plurality of select signal outputs;

a multiplexer having a plurality of select signal inputs subject to a specified select signal constraint, wherein the select signal constraint indicates that if a given one of the plurality of select signal inputs receives a select signal at a particular logic level, one or more other ones of the plurality of select signal inputs receive respective select signals at another logic level; and scan test circuitry comprising at least one scan chain having a plurality of scan cells coupled between respective ones of the select signal outputs of the decoder and respective ones of the select signal inputs of the multiplexer;

the scan test circuitry being configured to control at least a given one of the scan cells so as to prevent violation of the select signal constraint in conjunction with scan testing.

2. The integrated circuit of claim 1 wherein the multiplexer is a one-hot multiplexer and the specified select signal constraint indicates that only one of the select signal inputs should receive a logic high select signal at a particular time.

3. The integrated circuit of claim 1 wherein the multiplexer is a one-cold multiplexer and the specified select signal constraint indicates that only one of the select signal inputs should receive a logic low select signal at a particular time.

4. The integrated circuit of claim 1 wherein the scan test circuitry is configured to control at least a given one of the scan cells so as to prevent violation of the select signal constraint in conjunction with scan testing without requiring gating of an output of the given scan cell.

5. The integrated circuit of claim 1 wherein the decoder comprises a functional decoder and the integrated circuit further comprises a test decoder having functionality substantially the same as that of the functional decoder.

6. The integrated circuit of claim 5 wherein inputs of the test decoder are coupled to respective outputs of respective scan cells of the scan chain.

7. The integrated circuit of claim 6 wherein the outputs of the respective scan cells comprise test decoder outputs of the respective scan cells.

8. The integrated circuit of claim 6 wherein the outputs of the respective scan cells comprise scan outputs of the respective scan cells.

9. The integrated circuit of claim 5 wherein outputs of the test decoder are coupled to respective test decoder inputs of respective scan cells of the scan chain.

10. The integrated circuit of claim 9 wherein during a scan shift mode of operation, the scan cells are configured such that the test decoder inputs of the respective scan cells control respective functional data outputs of those scan cells in a manner that prevents violation of the select signal constraint of the multiplexer.

11. The integrated circuit of claim 5 wherein the given scan cell comprises:
a functional data input coupled to one of the select signal outputs of the functional decoder;
a functional data output coupled to one of the select signal inputs of the multiplexer;
a scan input coupled to a scan output of a previous one of the scan cells of the scan chain;
a scan output coupled to a scan input of a subsequent one of the scan cells of the scan chain;
a test decoder input coupled to an output of the test decoder; and
a test decoder output coupled to an input of the test decoder.

12. The integrated circuit of claim 11 wherein the given scan cell further comprises:
a first circuit comprising a master latch and a slave latch;

a second circuit comprising a master latch and a slave latch;
selection circuitry; and
a buffer circuit;
wherein the selection circuitry is configured to couple a selected one of the functional data input and the test decoder input to an input of the master latch of the first circuit responsive to a logic level of a shift enable signal;
wherein the selection circuitry is further configured to couple a selected one of the functional data input and the scan input to an input of the master latch of the second circuit responsive to the logic level of the shift enable signal;
wherein outputs of the respective slave latches of the first and second circuits are coupled to the respective functional data output and scan output of the given scan cell; and
wherein the scan input is coupled to an input of the buffer circuit and the output of the buffer circuit is coupled to the test decoder output of the scan cell.

13. The integrated circuit of claim 12 wherein during a scan shift mode of operation, the test decoder input of the given scan cell is coupled to the input of the master latch of the first circuit such that the functional data output of the scan cell is controlled by the test decoder.

14. The integrated circuit of claim 5 wherein the given scan cell comprises:
a functional data input coupled to one of the select signal outputs of the functional decoder;
a functional data output coupled to one of the select signal inputs of the multiplexer;
a scan input coupled to a scan output of a previous one of the scan cells of the scan chain;
a scan output coupled to a scan input of a subsequent one of the scan cells of the scan chain; and
a test decoder input coupled to an output of the test decoder;
wherein the scan output is also coupled to an input of the test decoder.

15. The integrated circuit of claim 14 wherein the given scan cell further comprises:
first, second and third latches;
selection circuitry; and
one or more logic gates;
wherein the selection circuitry is configured to couple a selected one of the functional data input, the test decoder input and the scan input to an input of the first latch responsive to respective logic levels of a shift enable signal and a first clock signal;
wherein the selection circuitry is further configured to couple an output of the first latch to a selected one of an input of the second latch and an input of the third latch responsive to the logic level of the first clock signal;
wherein the first latch has an enable input of a first type adapted to receive a second clock signal;
wherein the third latch has an enable input of a second type different than the first type and adapted to receive the second clock signal;
wherein the second latch has an enable input of the second type and adapted to receive a third clock signal generated by said one or more logic gates as a function of the first and second clock signals; and
wherein outputs of the respective second and third latches are coupled to the respective functional data output and scan output of the given scan cell.

16. The integrated circuit of claim 15 wherein during a scan shift mode of operation, the test decoder input of the given scan cell is coupled to the input of the first latch such that the functional data output of the scan cell is controlled by the test decoder.

17. The integrated circuit of claim 1 wherein during a scan shift mode of operation, the scan cells of the scan chain are configured to form a circular shift register with a scan input of an initial one of the scan cells of the scan chain being coupled to a scan output of a final one of the scan cells of the scan chain.

18. The integrated circuit of claim 17 wherein the scan cells of the scan chain are configured such that all of the scan cells of the scan chain other than a selected one of the scan cells have reset inputs coupled to a reset signal line and the selected one of the scan cells has its set input coupled to the reset signal line, and further wherein application of a reset signal to the reset signal line in a test initialization mode of operation prior to the scan shift mode of operation prevents violation of the select signal constraint of the multiplexer during the scan shift mode of operation.

19. A processing device comprising the integrated circuit of claim 1.

20. The processing device of claim 19 wherein the integrated circuit comprises a disk drive controller.

21. A method comprising:
generating a plurality of select signals for application to respective select signal inputs of a multiplexer via respective scan cells of a scan chain; and
controlling at least a given one of the scan cells so as to prevent violation of a specified select signal constraint of the multiplexer in conjunction with scan testing, wherein the select signal constraint indicates that if a given one of the plurality of select signal inputs receives a select signal at a particular logic level, one or more other ones of the plurality of select signal inputs receive respective select signals at another logic level.

22. A computer program product comprising a non-transitory computer-readable storage medium having computer program code embodied therein for use in scan testing an integrated circuit, wherein the computer program code when executed causes the steps of the method of claim 21 to be performed.

23. A processing system comprising:
a processor; and
a memory coupled to the processor and configured to store information characterizing an integrated circuit design;
wherein the processing system is configured to provide scan test circuitry within the integrated circuit design, the integrated circuit design comprising:
a decoder having a plurality of select signal outputs; and
a multiplexer having a plurality of select signal inputs subject to a specified select signal constraint, wherein the select signal constraint indicates that if a given one of the plurality of select signal inputs receives a select signal at a particular logic level, one or more other ones of the plurality of select signal inputs receive respective select signals at another logic level;
the scan test circuitry comprising at least one scan chain having a plurality of scan cells coupled between respective ones of the select signal outputs of the decoder and respective ones of the select signal inputs of the multiplexer;
the scan test circuitry being configured to control at least a given one of the scan cells so as to prevent violation of the select signal constraint in conjunction with scan testing.

* * * * *